(12) United States Patent
Dong et al.

(10) Patent No.: US 11,881,901 B2
(45) Date of Patent: Jan. 23, 2024

(54) DIGITAL ISOLATOR COMPRISING AN ISOLATION ELEMENT WITH A FIRST SECONDARY WINDING FOR GENERATING A FIRST DIFFERENTIAL SIGNAL IN PHASE WITH AN ENCODED SIGNAL AND A SECOND SECONDARY WINDING FOR GENERATING A SECOND DIFFERENTIAL SIGNAL IN AN OPPOSITE PHASE WITH THE ENCODED SIGNAL

(71) Applicant: Silergy Semiconductor Technology (Hangzhou) LTD, Hangzhou (CN)

(72) Inventors: Yufei Dong, Hangzhou (CN); Xiaodong Huang, Hangzhou (CN); Chen Zhao, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 0 days.

(21) Appl. No.: 18/074,720

(22) Filed: Dec. 5, 2022

(65) Prior Publication Data
US 2023/0198635 A1 Jun. 22, 2023

(30) Foreign Application Priority Data
Dec. 17, 2021 (CN) .......................... 202111556131.4

(51) Int. Cl.
*H04B 10/80* (2013.01)
*H03F 3/45* (2006.01)
*H04L 25/49* (2006.01)

(52) U.S. Cl.
CPC ............ *H04B 10/802* (2013.01); *H03F 3/45* (2013.01); *H04L 25/49* (2013.01)

(58) Field of Classification Search
CPC .. H03F 3/45; H04B 10/80; H04B 3/00; H04B 3/02; H04B 10/51; H04L 25/49; H04L 25/40; H03K 19/00
USPC .............................................. 250/551, 214 R
See application file for complete search history.

(56) References Cited

U.S. PATENT DOCUMENTS

| 8,847,503 | B2 | 9/2014 | Chang et al. |
| 9,673,721 | B2 | 6/2017 | Trescases et al. |
| 10,038,403 | B2 | 7/2018 | Kamath et al. |
| 11,441,928 | B2 * | 9/2022 | Lehmann ............... G01D 18/00 |

* cited by examiner

*Primary Examiner* — Que Tan Le

(57) ABSTRACT

A digital isolator can include: an encoding circuit configured to receive an input digital signal, and to generate an encoded signal according to the input digital signal; an isolation element having a primary winding, a first secondary winding, and a second secondary winding; a differential circuit configured to receive first and second differential signals, and to generate a difference signal according to the first and second differential signals; and a decoding circuit coupled with the differential circuit, and being configured to receive the difference signal, and to generate a target digital signal after decoding.

12 Claims, 10 Drawing Sheets

DIGITAL ISOLATOR COMPRISING AN ISOLATION ELEMENT WITH A FIRST SECONDARY WINDING FOR GENERATING A FIRST DIFFERENTIAL SIGNAL IN PHASE WITH AN ENCODED SIGNAL AND A SECOND SECONDARY WINDING FOR GENERATING A SECOND DIFFERENTIAL SIGNAL IN AN OPPOSITE PHASE WITH THE ENCODED SIGNAL

RELATED APPLICATIONS

This application claims the benefit of Chinese Patent Application No. 202111556131.4, filed on Dec. 17, 2021, which is incorporated herein by reference in its entirety.

FIELD OF THE INVENTION

The present invention generally relates to the field of power electronics, and more particularly to digital isolators.

BACKGROUND

A digital isolator is a kind of device in electronic system, which has high resistance isolation characteristics when digital signals and analog signals are transmitted, in order to realize isolation between the electronic system and users. Optocoupler, inductive/magnetic isolation, and capacitive isolation are commonly used for this purpose. Circuit designers may introduce isolation in order to meet safety requirements, or to reduce noise of the grounding loop. Current isolation can ensure that data transmission is not through electrical connections or through leakage paths, thus avoiding security risks.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Figure 1:
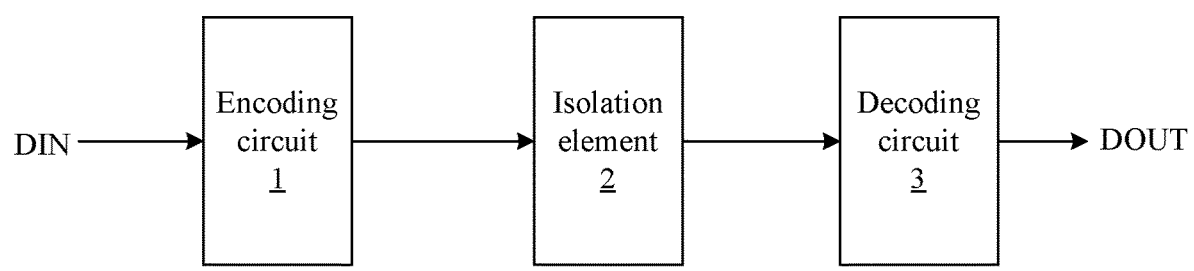
FIG. 1 is a schematic block diagram of an example digital isolator.

Referring now to FIG. 1, shown is a schematic block diagram of an example digital isolator. In this example, the digital isolator can include encoding circuit 1, isolation element 2, and decoding circuit 3. Encoding circuit 1 may receive input digital signal DIN, and can generate an encoded signal according to input digital signal DIN. Digital element 2 can include a transformer or capacitor, and may transmit the encoded signal to the decoding circuit through electromagnetic induction between the primary side and the secondary side of the transformer. Decoding circuit 3 can decode the received encoded signal to obtain target digital signal DOUT corresponding to input digital signal DIN, thus realizing electrical isolation transmission of the digital signal.

Figure 2:
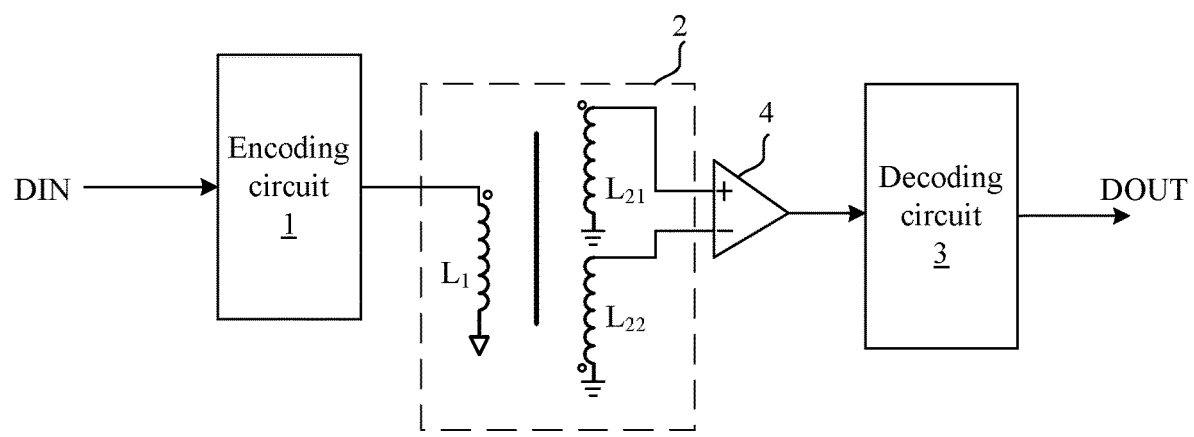
FIG. 2 is a schematic block diagram of a first example digital isolator, in accordance with embodiments of the present invention.

Referring now to FIG. 2, shown is a schematic block diagram of a first example digital isolator, in accordance with embodiments of the present invention. In this particular example, the digital isolator can include encoding circuit 1, isolation element 2, differential circuit 4, and decoding circuit 3. Encoding circuit 1 may receive input digital signal DIN, and can generate an encoded signal according to input digital signal DIN. The encoded signal may be a pulse signal formed by encoding the rising edges, or by falling edges of input digital signal DIN. Isolation element 2 can include primary winding $L_1$, secondary winding $L_{21}$, and secondary winding $L_{22}$. Here, primary winding $L_1$ can connect to the encoding circuit for receiving encoded signals.

Secondary windings $L_{21}$ and $L_{22}$ can be electrically isolated from primary winding $L_1$. In this example, secondary winding $L_{21}$ can generate a first differential signal in phase with the encoded signal through electromagnetic induction, and secondary winding $L_{22}$ can generate a second differential signal in opposite phase with the encoded signal through electromagnetic induction. Differential circuit 4 may receive the first and second differential signals, and can generate a difference signal according to the first and second differential signals. Decoding circuit 3 can connect with differential circuit 4, and may receive the difference signal, and can accordingly decode in order to generate target digital signal DOUT.

In particular embodiments, two windings are arranged on the secondary side, and one secondary winding can output a signal with the same phase as the encoded signal generated by the encoding circuit of the digital isolator. Also, the other secondary winding can output a signal with the opposite phase as the encoded signal generated by the encoding circuit of the digital isolator. Then, the differential circuit can differentiate the two signals, which can effectively eliminate common mode interference and improve the anti-interference performance of the digital isolator.

In this particular example, the primary side may have one primary winding, while the secondary side has two secondary windings (e.g., secondary windings $L_{21}$ and $L_{22}$). Differential circuit 4 can be a differential amplifier. A dotted terminal of primary winding $L_1$ can connect to encoding circuit 1, and a non-dotted terminal of primary winding $L_1$ can connect to the primary reference ground. A dotted terminal of secondary winding $L_{21}$ can connect to a non-inverting input terminal of the differential amplifier, and a non-dotted terminal of secondary winding $L_{21}$ can connect to the secondary reference ground. A dotted terminal of secondary winding $L_{22}$ can connect to the reference secondary ground, and a non-dotted terminal of secondary winding $L_{22}$ can connect to an inverting input terminal of the differential amplifier. That is, the connection modes of the dotted terminals of secondary windings $L_{21}$ and $L_{22}$ can be opposite.

Therefore, the signal generated by secondary winding $L_{21}$ through induction can be in phase with the input signal of the primary winding, and the signal generated by secondary winding $L_{22}$ through induction may be in opposite phase with the input signal of the primary winding, such that a differential signal can be generated at the secondary side. In addition, because the common-mode noise is typically generated during the transmission of the isolation element, both the non-inverting signal of the encoded signal and the inverting signal of the encoded signal may have a same-phase common-mode noise after transmission through the isolation element. Therefore, the common-mode noise in the two signals can be removed by obtaining the difference value of the differential signal through the differential amplifier, thereby effectively eliminating the common-mode interference and improving the anti-interference performance of the digital isolator.

Figure 3:
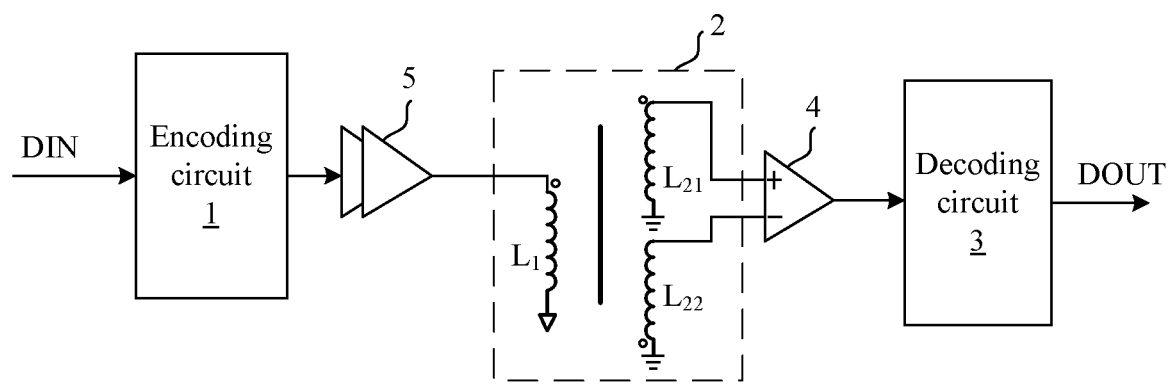
FIG. 3 is a schematic block diagram of a second example digital isolator, in accordance with embodiments of the present invention.

Referring now to FIG. 3, shown is a schematic block diagram of a second example digital isolator, in accordance with embodiments of the present invention. For example, the digital isolator can include buffer 5. In this particular example, buffer 5 can connect between an output terminal of the coding circuit and the dotted terminal of primary winding $L_1$. Therefore, the encoded signal output by the encoding circuit can be enhanced by buffer 5, such that the signal strength in the subsequent signal transmission process is enhanced, which may further improve signal transmission quality. In order to meet the demands of miniaturization, the winding can be set as planar coils and in different forms according to particular requirements.

Figure 4:
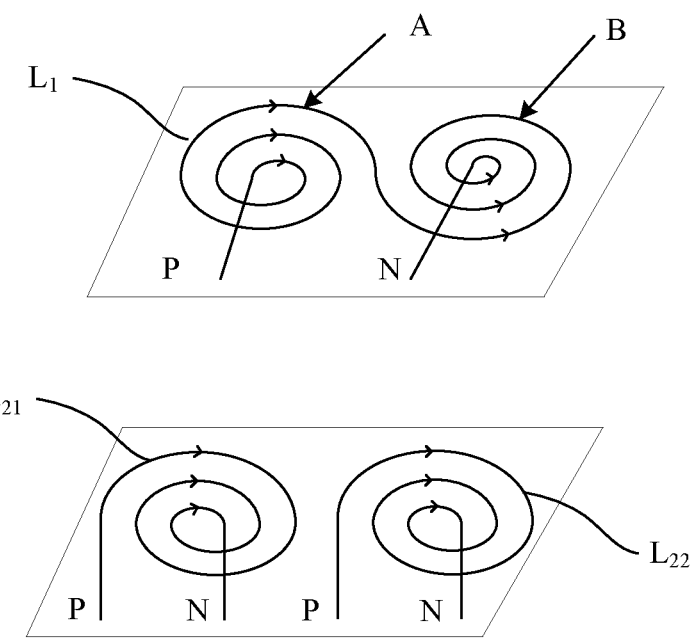
FIG. 4 is a schematic diagram of a first example coil arrangement of the isolation element in the digital isolator, in accordance with embodiments of the present invention.

Referring now to FIG. 4, shown is a schematic diagram of a first example coil arrangement of the isolation element in the digital isolator, in accordance with embodiments of the present invention. In this particular example, primary winding $L_1$ can be wound by planar coils (e.g., coils formed on the same plane). Secondary windings $L_{21}$ and $L_{22}$ can respectively be wound by plane coils (e.g., coils formed on the same plane) arranged side by side, and the winding directions of secondary windings $L_{21}$ and $L_{22}$ can be the same. In this example, primary winding $L_1$ can include part A wound in a first direction, and part B wound in a second direction, whereby parts A and B are arranged side by side. Here, the first and second directions are different. Also, secondary winding $L_{21}$ can be arranged corresponding to part A, and secondary winding $L_{22}$ may be arranged corresponding to part B. For example, when the first direction is clockwise, the second direction is counterclockwise.

Further, part A of primary winding $L_1$ can be wound clockwise from the dotted terminal (e.g., terminal P), and part B can be wound counterclockwise from the end of part A to the non-dotted terminal (e.g., terminal N) of primary winding $L_1$. Also, secondary windings $L_{21}$ and $L_{22}$ may both be wound clockwise from the dotted terminal (e.g., terminal P) to the non-dotted terminal (e.g., terminal N) of themselves. Therefore, the primary winding and the secondary windings can be wound by coils in such a manner, such that the secondary windings can generate a first differential signal in phase with the encoded signal and a second differential signal in opposite phase with the encoded signal through electromagnetic induction.

In this example, insulating materials can be arranged between secondary windings $L_{21}$ and $L_{22}$, in order to reduce the mutual influence in the electromagnetic induction process. For example, the insulating materials can be polyimide (e.g., nylon), SiO2, or Si3N4, to name just a few examples. In this example, by dividing the primary winding into two parts which are wound in different directions and arranged side by side, the primary winding can be effectively coupled with two secondary windings, in order to obtain the inverted signals through the two secondary windings at the same time. Further, the primary winding and the secondary windings can be planar metal patterns, such that the isolation structure can be formed on a circuit board or a wafer.

Figure 5:
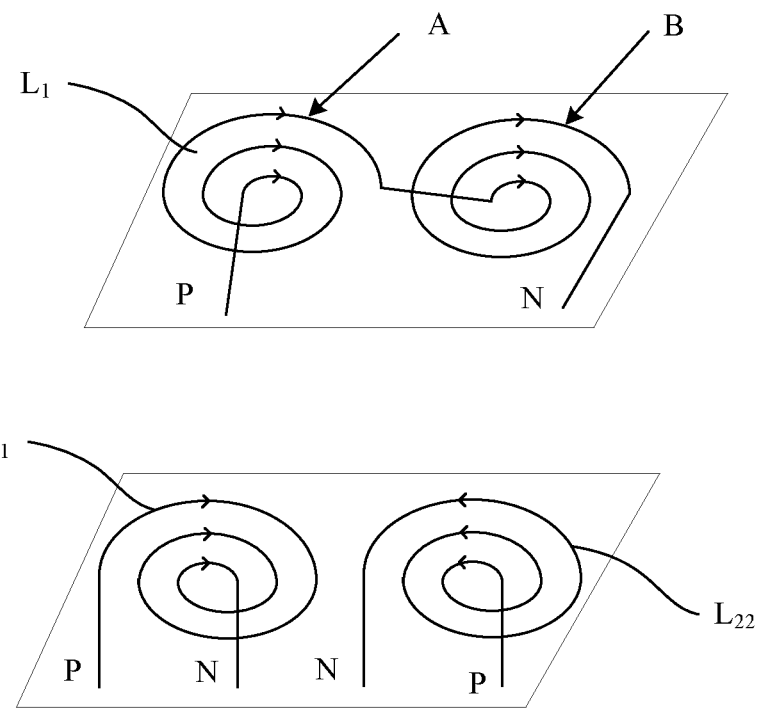
FIG. 5 is a schematic diagram of a second example coil arrangement of the isolation element in the digital isolator, in accordance with embodiments of the present invention.

Referring now to FIG. 5, shown is a schematic diagram of a second example coil arrangement of the isolation element in the digital isolator, in accordance with embodiments of the present invention. In this particular example, primary winding $L_1$ can be wound by planar coils (e.g., coils formed on the same plane), and secondary windings $L_{21}$ and $L_{22}$ may be respectively wound by planar coils (e.g., coils formed on the same plane) arranged side by side and wound in different directions. In this example, primary winding $L_1$ can include parts A and B wound in the first direction, whereby parts A and B are arranged side by side. In addition, secondary winding $L_{21}$ can be arranged corresponding to part A, and secondary winding $L_{22}$ may be arranged corresponding to part B. For example, parts A and B of primary winding $L_1$ may both be wound clockwise.

In addition, secondary winding $L_{21}$ can be wound clockwise from the dotted terminal (e.g., terminal P) to the non-dotted terminal (e.g., terminal N) of itself, and secondary winding $L_{22}$ may be wound counterclockwise from the dotted terminal (e.g., terminal P) to the non-dotted terminal (e.g., terminal N) of itself. Therefore, the primary winding and the secondary windings can be wound by coils in such a manner, such that the secondary windings can generate a first differential signal in phase with the encoded signal, and a second differential signal in opposite phase with the encoded signal through electromagnetic induction. In this example, by dividing the primary winding into two parts arranged side by side, and setting the secondary windings in different winding directions, the primary winding can be effectively coupled with the two secondary windings, in order to obtain the inverted signals through the two secondary windings.

Figure 6:
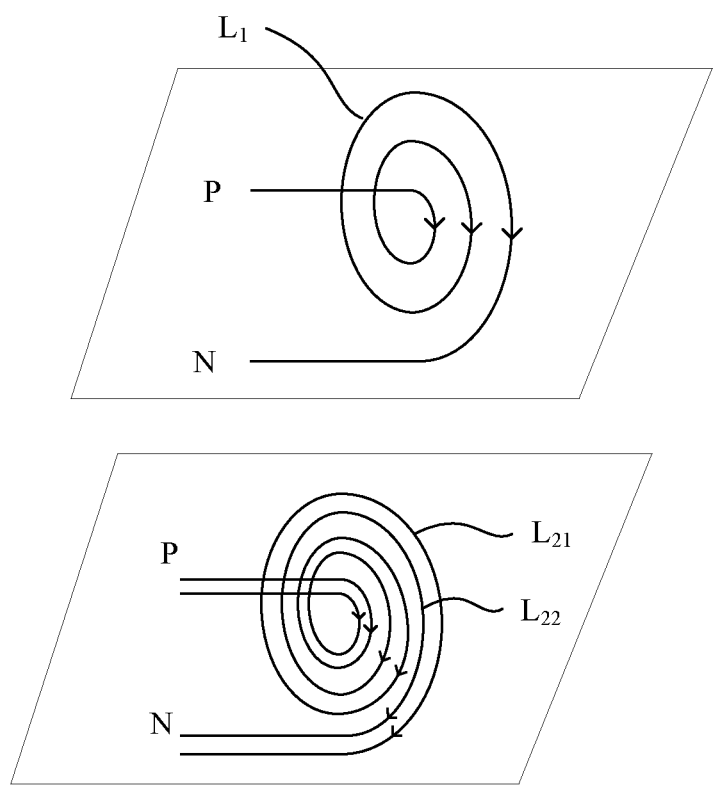
FIG. 6 is a schematic diagram of a third example coil arrangement of the isolation element in the digital isolator, in accordance with embodiments of the present invention.

Referring now to FIG. 6, shown is a schematic diagram of a third example coil arrangement of the isolation element in the digital isolator, in accordance with embodiments of the present invention. In this particular example, primary winding $L_1$ can be wound by planar coils (e.g., coils formed in the same plane). Secondary windings $L_{21}$ and $L_{22}$ can respectively be wound by planar coils which are overlapped or nested with each other and wound in the same direction. Furthermore, primary winding $L_1$ can be wound clockwise, and secondary windings $L_{21}$ and $L_{22}$ may be wound in parallel clockwise to form nested planar coils. Furthermore, in order to reduce the mutual influence between secondary windings $L_{21}$ and $L_{22}$ during electromagnetic induction, insulating materials, such as polyimide (e.g., nylon), SiO2, or Si3N4, etc., can be arranged between secondary windings $L_{21}$ and $L_{22}$.

In particular embodiments, the primary winding and the secondary windings can be wound and arranged in such a manner, so that the secondary windings can generate the first differential signal in phase with the encoded signal, and the second differential signal in opposite phase with the encoded signal through electromagnetic induction. In addition, through the above-mentioned various coil winding methods, flexible choices can be provided for the setting/predetermining of the digital isolator, which can improve the applicability of the digital isolator.

Figure 7:
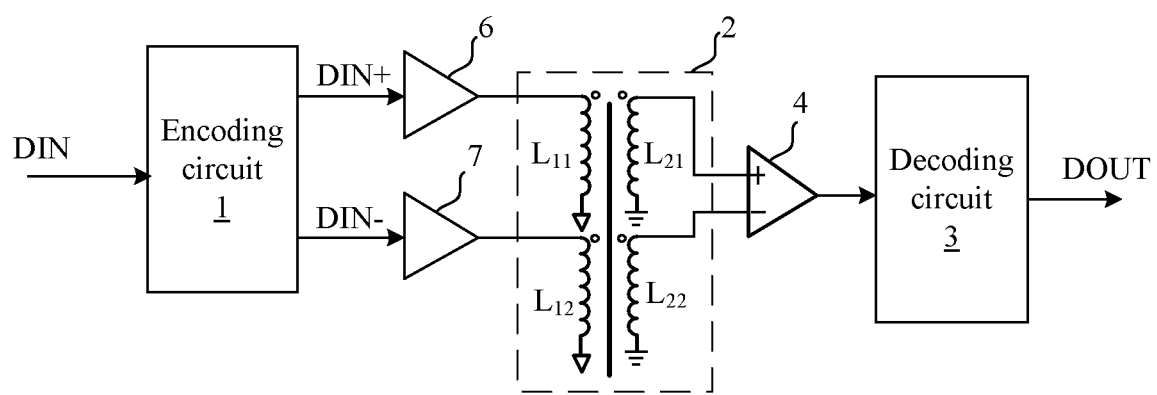
FIG. 7 is a schematic block diagram of a third example digital isolator, in accordance with embodiments of the present invention.

Referring now to FIG. 7, shown is a schematic block diagram of a third example digital isolator, in accordance with embodiments of the present invention. In this particular example, the digital isolator can include encoding circuit 1, isolation element 2, decoding circuit 3, and differential circuit 4. Encoding circuit 1 can receive input digital signal DIN, and may generate encoding signals DIN+ and DIN− according to input digital signal DIN. Isolation element 2 can include primary winding $L_1$, secondary winding $L_{21}$, and secondary winding $L_{22}$. In this example, primary winding $L_1$ can include primary windings $L_{11}$ and $L_{12}$. Here, primary winding $L_{11}$ can be electromagnetically coupled with secondary winding $L_{21}$, and may receive encoded signal DIN+. Primary winding $L_{12}$ can be electromagnetically coupled with secondary winding $L_{22}$, and may receive encoded signal DIN− (e.g., an inverted signal of encoded signal DIN+). Differential circuit 4 can be a differential amplifier for receiving encoded signal DIN+ transmitted by secondary winding $L_{21}$, and encoded signal DIN− transmitted by secondary winding $L_{22}$, and for generating a difference signal according to the received signals. Decoding circuit 3 can connect with the differential amplifier, and may receive the difference signal and decode in order to generate target digital signal DOUT.

In particular embodiments, the primary side of the isolation element in the original transformer can be adjusted to a structure including a first primary winding and a second primary winding, and the secondary side can be adjusted to a structure including a first secondary winding and a second secondary winding. Also, the secondary windings may respectively generate a first differential signal which is in phase with the encoded signal, and a second differential signal which is in opposite phase with the encoded signal. The differential circuit can generate the difference signal according to the first and second differential signals, in order to realize the differential transmission of encoded signals. By using the advantages of differential signal transmission in common mode rejection, the signal strength during signal transmission can be improved, the anti-interference ability of the digital isolator can be improved, and the quality of digital signal transmission can also be improved.

As shown in FIG. 7, the digital isolator of this example can also include buffers 6 and 7. The input terminal of buffer 6 can connect to one output terminal of the encoding circuit, and the output terminal of buffer 6 can connect to the dotted terminal of the first primary winding. The input terminal of buffer 7 can connect to another output terminal of the encoding circuit, and the output terminal of buffer 7 can connect to the dotted terminal of the second primary winding. Therefore, buffers 6 and 7 can respectively enhance the encoded signal and the inverted signal of the encoded signal output by the encoding circuit, such that the signal strength in the subsequent signal transmission process is improved, which can further improve signal transmission quality.

For example, the dotted terminal of the primary winding $L_{11}$ can connect to one output terminal of the encoding circuit, and the non-dotted terminal can connect to the primary reference ground. The dotted terminal of the primary winding Liz can connect to another output terminal of the encoding circuit, and the non-dotted terminal can connect to the primary reference ground. The dotted terminal of secondary winding $L_{21}$ can connect to the non-inverting input of the differential amplifier, and the non-dotted terminal of secondary winding $L_{21}$ can connect to the secondary reference ground. The dotted terminal of secondary winding $L_{22}$ can connect to the inverting input of the differential amplifier, and the non-dotted terminal of secondary winding $L_{22}$ can connect to the secondary reference ground.

In this example, primary winding $L_{11}$ and secondary winding $L_{21}$, and primary winding $L_{12}$ and secondary winding $L_{22}$ can adopt the same or two different iron cores, in order to realize electromagnetic coupling. Therefore, the digital isolator with differential transmission structure can be arranged by the above connection mode, which may improve the anti-interference ability of the digital isolator, and realize the high-quality transmission of the input digital signal. Furthermore, the primary windings may respectively transmit the encoded signal and the inverted signal of the encoded signal, which can ensure the validity and accuracy of the information in the encoded signal during the transmission process, reduce the signal interference, and further improve the anti-interference ability of the digital isolator and the transmission quality of the input digital signal.

Figure 8:
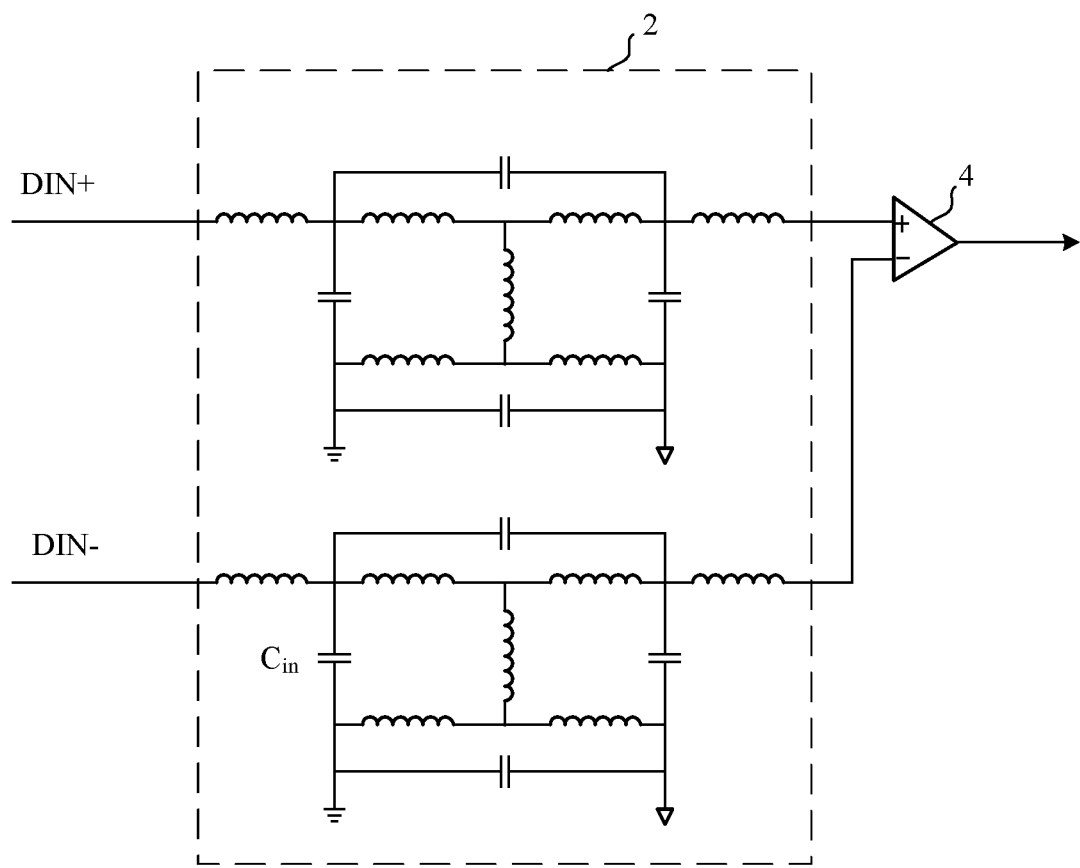
FIG. 8 is an equivalent circuit diagram of the isolation element considering parasitic parameters, in accordance with embodiments of the present invention.

Referring now to FIG. 8, shown is an equivalent circuit diagram of the isolation element considering parasitic parameters, in accordance with embodiments of the present invention. In this particular example, the parasitic parameters in the isolation element shown in FIG. 7 are considered in the equivalent circuit diagram. As shown in FIG. 8, isolation element 2 can be equivalent to an oscillation circuit including input capacitors, output capacitors and common-mode capacitors. When encoded signal DIN+ and inverted signal DIN− of encoded signal DIN+ are respectively input to the two input terminals of isolation element 2, an oscillation signal can be generated between the signal lines of the two channels and the ground. Because the impedances of the two channels are matched, the first and second differential signals output by the two channels to differential amplifier 4 can essentially be the same. In addition, differential amplifier 4 can perform differential processing on the first and second differential signals, which can counteract the influence of oscillation and improve the common mode rejection capability of the digital isolator.

Figure 9:
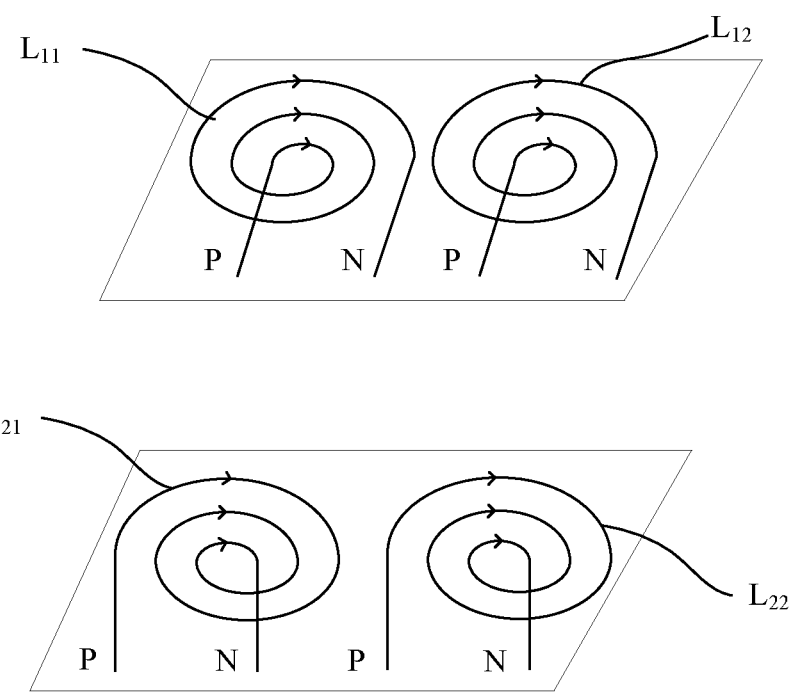
FIG. 9 is a schematic diagram of a fourth example coil arrangement of the isolation element in the digital isolator, in accordance with embodiments of the present invention.

Referring now to FIG. 9, shown is a schematic diagram of a fourth example coil arrangement of the isolation element in the digital isolator, in accordance with embodiments of the present invention. In this particular example, the primary winding can include primary windings $L_{11}$ and $L_{12}$, which can respectively be wound by plane coils arranged side by side and wound in the same direction. Also, secondary windings $L_{21}$ and $L_{22}$ can respectively be wound by plane coils arranged side by side and wound in the same direction.

In this example, primary winding $L_{11}$, primary winding $L_{12}$, secondary winding $L_{21}$, and secondary winding $L_{22}$ can all be wound clockwise from the dotted terminals (e.g., terminal P) to the non-dotted terminals (e.g., terminal N) of themselves. Therefore, the secondary windings may generate a first differential signal in phase with the encoded signal, and a second differential signal in opposite phase with the encoded signal through electromagnetic induction. In addition, insulation materials (e.g., polyimide or nylon, SiO2, Si3N4, etc.) can be arranged between primary windings $L_{11}$ and $L_{12}$, and between secondary windings $L_{21}$ and $L_{22}$, in order to reduce the mutual influence between primary windings $L_{11}$ and $L_{12}$, and between secondary windings $L_{21}$ and $L_{22}$ during digital signal transmission.

Figure 10:
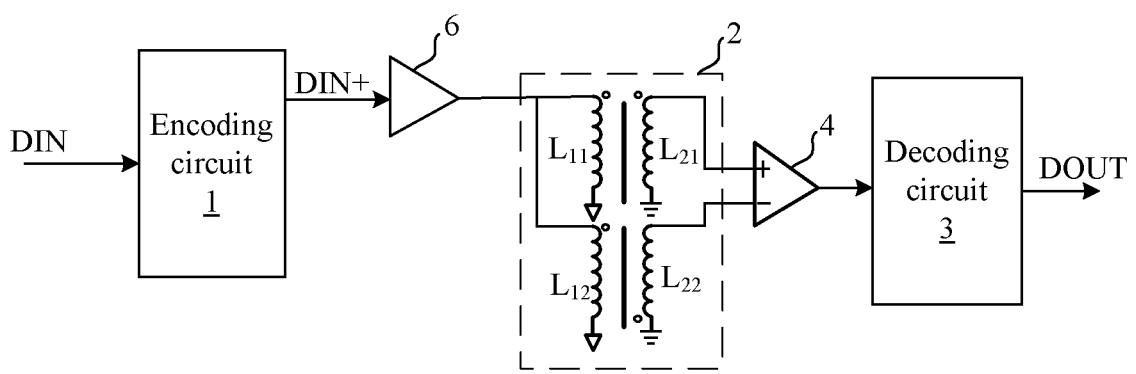
FIG. 10 is a schematic block diagram of a fourth example digital isolator, in accordance with embodiments of the present invention.

Referring now to FIG. 10, shown is a schematic block diagram of a fourth example digital isolator, in accordance with embodiments of the present invention. In this particular example, the digital isolator can include encoding circuit 1, isolation element 2, differential circuit 4, and decoding circuit 3. For example, encoding circuit 1 may receive input digital signal DIN, and can encoded signal DIN+ according to input digital signal DIN. Isolation element 2 can include primary winding $L_1$, secondary winding $L_{21}$, and secondary winding $L_{22}$. Further, primary winding $L_1$ can include primary windings $L_{11}$ and $L_{12}$. Here, primary winding $L_{11}$ can be electromagnetically coupled with secondary winding $L_{21}$, and may receive encoded signal DIN+. Primary winding $L_{12}$ can be electromagnetically coupled with secondary winding $L_{22}$, and may receive encoded signal DIN+. Differential circuit 4 may be a differential amplifier, which can receive encoded signal DIN+ transmitted by secondary windings $L_{21}$ and $L_{22}$, and can generate a difference signal according to the received signals. Decoding circuit 3 can connect with the differential amplifier, and may receive the difference signal and decode in order to generate target digital signal DOUT.

For example, the dotted terminal of primary winding $L_{11}$ can connect to the encoding circuit and the non-dotted terminal of primary winding $L_{11}$ can connect to the primary reference ground. The dotted terminal of primary winding $L_{12}$ can connect to the encoding circuit, and the non-dotted terminal of primary winding $L_{12}$ can connect to the primary reference ground. The dotted terminal of secondary winding $L_{21}$ can connect to the non-inverting input of the differential amplifier, and the non-dotted terminal of secondary winding $L_{21}$ can connect to the secondary reference ground, thereby receiving encoded signal DIN+. The dotted terminal of secondary winding $L_{22}$ can connect to the secondary reference ground, and the non-dotted terminal of secondary winding $L_{22}$ can connect to the inverting input of the differential amplifier, thereby receiving the inverted signal of encoded signal DIN+.

In particular embodiments, primary winding $L_{11}$ and secondary winding $L_{21}$, and primary winding $L_{12}$ and secondary winding $L_{22}$ can include the same or two different iron cores, in order to realize electromagnetic coupling. Therefore, the digital isolator with differential transmission structure can be constructed by the above connection mode, which can improve the anti-interference ability of the digital isolator and realize high-quality transmission of the input digital signal. In addition, the primary windings can respectively transmit the encoded signal to the secondary windings, which can ensure the validity and accuracy of information during the transmission process of the encoded signal, reduce signal interference, and further improve the anti-interference capability of the digital isolator and improve the transmission quality of input digital signals.

For example, the digital isolator can also include buffer 6. An input terminal of buffer 6 can connect to the encoding circuit, and an output terminal of buffer 6 can connect to the dotted terminal of the first primary winding, which can transmit the encoded signal. Therefore, the encoded signal output by the encoding circuit can be enhanced by buffer 6, such that the signal strength in the subsequent signal transmission process is improved, which is beneficial to further improving the signal transmission quality.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A digital isolator, comprising:
a) an encoding circuit configured to receive an input digital signal, and to generate an encoded signal according to the input digital signal;
b) an isolation element having a primary winding, a first secondary winding, and a second secondary winding, wherein the primary winding is connected with the encoding circuit and used for receiving the encoded signal, the first secondary winding and the second secondary winding are coupled with the primary winding in an electrically isolated manner, the first secondary winding is used for generating a first differential signal in phase with the encoded signal through electromagnetic induction, and the second secondary winding is used for generating a second differential signal in an opposite phase with the encoded signal through electromagnetic induction;
c) a differential circuit configured to receive the first differential signal and the second differential signal, and to generate a difference signal according to the first differential signal and the second differential signal; and
d) a decoding circuit coupled with the differential circuit, and being configured to receive the difference signal, and to generate a target digital signal after decoding.

2. The digital isolator according to claim 1, wherein:
a) the differential circuit comprises a differential amplifier;
b) a dotted terminal of the primary winding is connected with the encoding circuit, and a non-dotted terminal of the primary winding is connected with a primary reference ground;
c) a dotted terminal of the first secondary winding is connected with a non-inverting input terminal of the differential amplifier, and a non-dotted terminal of the first secondary winding is connected with a secondary reference ground; and
d) a dotted terminal of the second secondary winding is connected with the secondary reference ground, and a non-dotted terminal of the second secondary winding is connected with an inverting input terminal of the differential amplifier.

3. The digital isolator according to claim 1, wherein:
a) the primary winding is wound by coils formed on the same plane, and the first secondary winding and the second secondary winding are respectively wound by coils arranged side by side on the same plane, and wound in the same direction;
b) the primary winding comprises a first part of coils wound in a first direction and a second part of coils wound in a second direction arranged side by side; and
c) the first direction and the second direction are different, and the first secondary winding is arranged corresponding to the first part of coils and the second secondary winding is arranged corresponding to the second part of coils.

4. The digital isolator according to claim 1, wherein:
a) the primary winding is wound by coils formed on the same plane, and the first secondary winding and the second secondary winding are respectively wound by coils arranged side by side on the same plane, and wound in different directions;
b) the primary winding comprises a first part of coils wound in a first direction and a second part of coils wound in the first direction arranged side by side; and
c) the first direction and the second direction are different, and the first secondary winding is arranged corresponding to the first part of coils and the second secondary winding is arranged corresponding to the second part of coils.

5. The digital isolator according to claim 1, wherein the primary winding is wound by coils formed on the same plane, and the first secondary winding and the second secondary winding are respectively wound by coils arranged overlapped or nested on the same plane and wound in the same direction.

6. The digital isolator according to claim 1, further comprising a first buffer having an input terminal coupled to the encoding circuit, and an output terminal coupled to a dotted terminal of the primary winding.

7. The digital isolator according to claim 1, wherein:
a) the differential circuit comprises a differential amplifier, and the primary winding comprises a first primary winding and a second primary winding;
b) the first primary winding is electromagnetically coupled with the first secondary winding for receiving the encoded signal; and
c) the second primary winding is electromagnetically coupled with the second secondary winding for receiving an inverted signal of the encoded signal.

8. The digital isolator according to claim 7, wherein:
a) a dotted terminal of the first primary winding is connected to the encoding circuit, and a non-dotted terminal of the first primary winding is connected to a primary reference ground;
b) a dotted terminal of the second primary winding is connected to the encoding circuit, and a non-dotted terminal of the second primary winding is connected to the primary reference ground;
c) a dotted terminal of the first secondary winding is connected to a non-inverting input terminal of the differential amplifier, and a non-dotted terminal of the first secondary winding is connected to a secondary reference ground;
d) a dotted terminal of the second secondary winding is connected to an inverting input terminal of the differential amplifier, and a non-dotted terminal of the second secondary winding is connected to the secondary reference ground; and
e) the first secondary winding is configured to receive the encoded signal, and the second secondary winding is configured to receive the inverted signal of the encoded signal.

9. The digital isolator according to claim 1, wherein:
a) the differential circuit comprises a differential amplifier, and the primary winding comprises a first primary winding and a second primary winding;
b) the first primary winding is electromagnetically coupled with the first secondary winding for receiving the encoded signal; and
c) the second primary winding is electromagnetically coupled with the second secondary winding for receiving the encoded signal.

10. The digital isolator according to claim 9, wherein:
a) a dotted terminal of the first primary winding is connected to the encoding circuit, and a non-dotted terminal of the first primary winding is connected to a primary reference ground;
b) a dotted terminal of the second primary winding is connected to the encoding circuit, and a non-dotted terminal of the second primary winding is connected to the primary reference ground;
c) a dotted terminal of the first secondary winding is connected to a non-inverting input terminal of the differential amplifier, and a non-dotted terminal of the first secondary winding is connected to a secondary reference ground;
d) a dotted terminal of the second secondary winding is connected to the secondary reference ground, and a non-dotted terminal of the second secondary winding is connected to an inverting input terminal of the differential amplifier; and
e) the first secondary winding is configured to receive the encoded signal and the second secondary winding is configured to receive the inverted signal of the encoded signal.

11. The digital isolator according to claim 10, wherein the first primary winding and the second primary winding are respectively wound by coils arranged side by side on the same plane and wound in the same direction, and the first secondary winding and the second secondary winding are respectively wound by coils arranged side by side on the same plane, and wound in the same direction.

12. The digital isolator according to claim 7, further comprising:
a) a second buffer having an input terminal coupled to the encoding circuit, and an output terminal coupled to a dotted terminal of the first primary winding to transmit the encoded signal; and
b) a third buffer having an input terminal coupled to the encoding circuit, and an output terminal coupled to a dotted terminal of the second primary winding to transmit the inverted signal of the encoded signal.

* * * * *